United States Patent [19]

Reisman et al.

[11] Patent Number: 5,145,714
[45] Date of Patent: Sep. 8, 1992

[54] METAL-ORGANIC CHEMICAL VAPOR DEPOSITION FOR REPAIRING BROKEN LINES IN MICROELECTRONIC PACKAGES

[75] Inventors: Arnold Reisman; Dorota Temple; Iwona Turlik, all of Raleigh, N.C.

[73] Assignees: MCNC, Research Triangle Park, N.C.; Northern Telecom Limited, Montreal, Canada

[21] Appl. No.: 605,688

[22] Filed: Oct. 30, 1990

[51] Int. Cl.$^5$ .................. B05D 3/06; B32B 35/00
[52] U.S. Cl. .................. 427/53.1; 427/54.1; 427/142; 427/140; 427/250; 427/124; 427/123; 427/314
[58] Field of Search .......... 427/53.1, 54.1, 250, 427/314, 142, 248.1, 123, 124, 140

[56] References Cited

U.S. PATENT DOCUMENTS

| | | | |
|---|---|---|---|
| 4,558,144 | 12/1985 | Fay et al. | 556/40 |
| 4,574,095 | 3/1986 | Baum et al. | 427/53.1 |
| 4,615,904 | 10/1986 | Ehrlich et al. | 427/53.1 |
| 4,659,591 | 4/1987 | Gärtner et al. | 427/253 |
| 4,724,219 | 2/1988 | Ridinger | 437/19 |
| 4,728,528 | 3/1988 | Ishihara et al. | 427/39 |
| 4,753,856 | 6/1988 | Haluska et al. | 428/698 |
| 4,778,693 | 10/1988 | Drozdowicz et al. | 427/53.1 |
| 4,948,623 | 8/1990 | Beach et al. | 427/35 |

FOREIGN PATENT DOCUMENTS 0297348 1/1989 European Pat. Off. .
63-294616 12/1988 Japan .
WO 81/01529 6/1981 PCT Int'l Appl. .

OTHER PUBLICATIONS

Oehi et al., "Thin copper films by plasma CVD using copper-hexafluoro-acetylacetonate", Appl. Phys. A 45 (1988) pp. 151-154.

Kodas et al., "Surface temperature rise induced by a focused laser beam. Application to laser-induced chemical vapor deposition". MRS vol. 75 (Boston, Mass.) Dec. 1986 pp. 57-63.

Temple and Reisman; Chemical Vapor Deposition of Copper from Copper (II) Hexafluoroacetylacetonate; Journal of Electrochemical Society; vol. 136, No. 11, Nov. 1989.

Houle; Composition, Structure, and Electric Field Variations in Photodeposition; Physical Review Letters; The American Physical Society; vol. 55, No. 20, pp. 2184–2187.

Marinero and Jones; Time-resolved detection of Cu atoms during photochemical laser metal vapor deposition; J. Chem. Phys. 82(3), Feb. 1, 1985; pp. 1608 1609.

Houle et al.; Surface processes leading to carbon contamination of photochemically deposited copper films; J. Vac. Sci. Technol. A 4(6), Nov./Dec. 1986 pp. 2452–2458.

Jones et al.; Photochemical generation of deposition of copper from a gas phase precursor; Appl. Phys. Lett. 46(1), Jan. 1, 1985; pp. 97–99.

Houle et al.; Laser chemical vapor deposition of copper; Appl. Phys. 46(2), Jan. 15, 1985; pp. 204–206.

Primary Examiner—Shrive Beck
Assistant Examiner—Roy V. King
Attorney, Agent, or Firm—Bell, Seltzer, Park & Gibson

[57] ABSTRACT

A thermally activated method of depositing a metal on a localized microscopic portion of a substrate, that can be carried out at relatively low process temperatures, and that is particularly useful for depositing metals in an amount and purity sufficient for electrical conductivity on substrates containing microelectronic circuits and devices or their respective precursors. The method comprises heating a substrate in the presence of a vaporized metal-organic composition to a first temperature that is just below the temperature at which the vaporized metal-organic composition will dissociate into a metal and an organic-containing portion, and then raising the temperature of a localized portion of the heated substrate from the first temperature to a second, higher temperature at which the vaporized metal-organic composition will dissociate into a metal and an organic-containing portion but below the temperature at which the organic-containing portion will decompose to produce and deposit organic decomposition products upon the localized portion, and until an amount of the dissociated metal sufficient for electrical conductivity deposits upon the localized portion.

19 Claims, No Drawings 5,145,714

METAL-ORGANIC CHEMICAL VAPOR DEPOSITION FOR REPAIRING BROKEN LINES IN MICROELECTRONIC PACKAGES

This invention was made with Government support under contract N00014-85-C-0871 awarded by the Department of the Navy. The Government has certain rights in the invention.

FIELD OF THE INVENTION

The present invention relates to the repair of metallic interconnection lines in microelectronic devices and circuits, and particularly relates to a method of interconnection line repair that incorporates metal-organic chemical vapor deposition of copper.

BACKGROUND OF THE INVENTION

In the manufacture of microelectronic devices and circuits, one of the evident needs is for electrically conductive connections between such devices and circuits. As known to those familiar with this technology, in present manufacturing techniques and structures, such connections often take the form of thin layers of metal. These layers are applied in various processes, such as photolithography, in appropriate patterns to form the desired electrical interconnection lines of the device or circuit. Because of the very small dimensions involved, however, repair or replacement of such conductive connecting lines is extremely difficult or impossible under most circumstances.

Additionally, as circuit dimensions decrease in very large scale integration (VLSI) devices, process limitations based upon an allowed thermal budget become increasingly important. Expressed somewhat generally, the thermal budget of a process is the combination of energy and time that must be invested to carry it out. Under most circumstances, lower thermal budgets are preferred over higher ones. As a result, methods of forming metallic thin films at relatively lower temperatures for purposes such as line interconnection are being widely investigated. Among these, one of the simplest and of lowest cost under certain circumstances is metal-organic chemical vapor deposition (MOCVD). A typical MOCVD technique is based upon the decomposition of a vaporized metal-organic compound through the application of some form of energy, for example heat or electromagnetic radiation, that results in the deposition of a metal, an alloy, or a compound in the form of a thin film.

A number of investigations have been carried out and corresponding techniques developed for chemical vapor deposition of metal-organic compounds. Although many of these have become useful for certain purposes, they have not been suitable for repair of electrical connections for a number of reasons.

For example, a number of the MOCVD processes have been developed as methods to repair mask templates in which the goal of depositing the metal from the metal-organic compound is to produce an opaque spot on the mask. It will be understood by those familiar with microelectronic devices and circuits, however, that the amount and characteristics of a material that may produce an opaque spot on a mask, are not nearly as specific as those required for electrical conductivity.

Additionally, to be useful in certain processes, the metal-organic compound must exhibit an appropriate chemical stability under the desired process parameters, must be volatile at a reasonable temperature without decomposition, and must have a sufficient vapor pressure at moderate temperatures to make the MOCVD process worthwhile for the particular application.

Furthermore, from a practical standpoint, and particularly for commercial applications, the deposition must take place at a reasonable rate. Accordingly, deposition processes that are theoretically or experimentally interesting may not be appropriate for commercial applications where the rate of deposition is an important standard.

Perhaps most importantly, particular metals are often either desired or even necessary in the wiring portions of devices and circuits. Electronic circuits are designed and fabricated on the basis of known properties of the interconnecting wiring, and any materials which are used to form or repair such wiring must similarly provide these properties. In particular, many line interconnection applications require copper because of its particular conductivity, impedance, and other related electrical characteristics.

In attempting MOCVD of copper, however, a number of problems exist. First, many of the organic ligands which can successfully be used to make metal-organic compounds suitable for MOCVD with other metals, simply do not form compounds with copper (e.g., for practical purposes copper carbonyls do not exist), or form compounds that are useless for all practical purposes (e.g. copper alkyls often tend to be nonvolatile). Therefore, many of the types of compounds and reactions used with other metals are not analogously available with copper.

Finally, for various reasons a thermally activated MOCVD process would be advantageous. Many of the present processes are instead photochemically initiable. Such a process would be useful in situations where photoexposure is undesired, unavailable, or must be avoided. For example, in CVD processes, photodecomposition of source species is often preferably avoided, and thermally initiated reactions often form better deposits.

Therefore, there exists the need for a method of placing or repairing copper conductive lines in microelectronic devices and circuits which is thermally activated, nonphotochemical, and which deposits copper in an amount, purity, and at a rate reasonable to produce such wiring connections in commercially useful processes.

SUMMARY OF THE INVENTION

The invention meets this and other objects by providing a thermally activated method of depositing a metal on a localized microscopic portion of a substrate. The method can be carried out at relatively low process temperatures, and is particularly useful for depositing metals in an amount and purity sufficient for electrical conductivity on substrates containing microelectronic circuits and devices or their respective precursors. The method comprises heating a substrate in the presence of a vaporized metal-organic composition to a first temperature that is just below the temperature at which the vaporized metal-organic composition will dissociate into a metal and an organic-containing portion. Then, the method comprises raising the temperature of a localized portion of the heated substrate from the first temperature to a second, higher temperature at which the vaporized metal-organic composition will dissociate into a metal and an organic-containing portion, but below the temperature at which the organic-containing portion will decompose to produce and deposit organic decomposition products upon the substrate, and until an amount of the dissociated metal sufficient for electrical conductivity deposits upon the localized portion.

The foregoing and other objects, advantages and features of the invention, and the manner in which the same are accomplished, will become more readily apparent upon consideration of the following detailed description of the invention.

DETAILED DESCRIPTION

The invention is a thermally activated method of depositing a metal on a localized portion of a substrate. The method can be carried out at relatively low process temperatures, thereby minimizing thermal budgets. The process is particularly useful for depositing metals in an amount and at a purity sufficient for electrical conductivity on substrates containing microelectronic circuits and devices or their respective precursors.

The method first comprises heating a substrate in the presence of a vaporized metal-organic composition to a first temperature that is just below the temperature at which the vaporized metal-organic composition will dissociate into a metal and an organic-containing portion. In many circumstances the appropriate substrate is a wafer of a semiconductor material such as silicon, and under such conditions, the method preferably comprises heating the entire substrate. It will be understood that if the substrate is unusually large, some portion of the substrate less than its entirety can be heated while still incorporating the method of the present invention.

The metal-organic composition is selected as one in which the relative bond strength is such that the metal-organic bond will break upon input of a lesser amount of energy than will the bonds in the organic-containing portion of the molecule. Preferably, and to simplify the overall process, a composition is selected in which these two respective energies are sufficiently separated for the temperature required to break the metal-organic bond to be correspondingly reasonably lower than the temperature required to thermally decompose the organic-containing portion.

One preferred group of compounds includes metal hexafluoroacetylacetonates. Furthermore, because one of the more desirable metals to be deposited is copper, the most preferred metal-organic compound is copper (II) hexafluoroacetylacetonate; e.g.

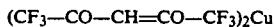

$(CF_3-CO-CH=CO-CF_3)_2Cu$

This compound is often informally abbreviated as Cu(hfa)$_2$ and will be abbreviated as such herein. Cu(hfa)$_2$ begins to vaporize significantly at about 70° C., and begins to dissociate into metallic copper and a volatile organic-containing species at temperatures of about 250° C. Thus, in preferred embodiments, the step of heating the substrate to a first temperature in the presence of vaporized Cu(hfa)$_2$ comprises heating the substrate to a temperature of no more than about 250° C., but nevertheless in the vicinity of that temperature. In the most preferred embodiments and as described in the experimental portion herein, the step of heating the substrate to the first temperature comprises thermally biasing the substrate, thereby avoiding the complications of photoreactivity, and most preferably comprises radiant heating of a suscepter upon which the substrate rests. As understood by those familiar with such techniques, thermally biasing an object such as the substrate is the technique of raising it to, and potentially maintaining the object at, a predetermined temperature. A common purpose for thermal biasing is to prepare the object, or keep it ready, for some additional processing step that is to follow.

The invention next comprises the step of raising the temperature of a localized portion of the heated substrate from the first temperature to a second, higher temperature at which the vaporized metal-organic composition will dissociate into a metal and an organic-containing portion, but below the temperature at which the organic-containing portion will decompose to produce and deposit organic decomposition products such as carbon upon the localized portion. The temperature is raised until an amount of the dissociated metal sufficient for electrical conductivity deposits upon the localized portion.

In preferred embodiments, the method comprises raising the temperature of a localized portion of the heated substrate in the presence of vaporized Cu(hfa)$_2$ to between about 340° C. and 390° C. Most preferably, the step of raising the temperature comprises directing a laser light onto the localized portion with the laser light having a frequency to which the substrate will respond thermally and with an intensity sufficient to produce the desired temperature.

In a more specific application, the invention further comprises a thermally activated method for depositing a film of low resistivity copper in an amount and purity sufficient for electrical conductivity on to the surface of a substrate to repair a broken electrical line thereon, and that likewise can be carried out at relatively low process temperatures.

In this embodiment, the method again comprises heating a substrate having an identified broken line thereon in the presence of vaporized Cu(hfa)$_2$ to a first temperature that is just below the temperature at which the vaporized Cu(hfa)$_2$ will dissociate into metallic copper and an organic-containing portion. The following step is that of raising the temperature of the substrate at a localized portion corresponding to the identified broken line to a second, higher temperature at which the vaporized Cu(hfa)$_2$ will dissociate into metallic copper and an organic-containing portion while below the temperature at which the organic-containing portion will decompose to produce deposit decomposition products upon the broken line, and until an amount of the dissociated metallic copper sufficient for electrical conductivity deposits upon the heated localized portion.

Further to this embodiment, the method can comprise the step of identifying the broken line on the surface of the substrate prior to the step of further heating the broken line to the second, higher temperature. As known to those familiar with microelectronic devices and currents, the presence of a broken line can often be recognized electronically, and its specific position located optically. Similarly, the step of heating the substrate in the presence of vaporized Cu(hfa)$_2$ can first comprise the step of introducing vaporized Cu(hfa)$_2$ adjacent to the substrate surface and then heating the substrate to the first temperature. As stated earlier, and based upon the dissociation characteristics of Cu(hfa)$_2$, this first temperature preferably is no more than 250° C.

In this regard, the step of raising the temperature of the identified broken line to the second, higher temperature, generally comprises raising the temperature of the identified broken line to a temperature greater than about 250° C., but less than about 650° C. As set forth in the experimental portion discussed herein, it has been found in accordance with the present invention that temperatures above 650° C. produce nothing but carbon deposits as the higher temperature causes a total thermal decomposition of the organic-containing portion of the Cu(hfa)$_2$ molecule.

Most preferably, the step of raising the temperature of the identified broken line to a second temperature comprises raising the temperature to between about 340° C. and 390° C. It has been found that at these temperatures, the deposit consists almost entirely of metallic copper with the proper conductivity characteristics desired for wiring and wiring repair.

In a most preferred embodiment, the step of raising the temperature of the heated substrate comprises directing laser light on to the localized portion of the heated substrate wherein the laser light has a frequency to which the substrate responds thermally and with an intensity sufficient to raise the temperature of the broken line from its heated temperature of no more than about 250° C. to the second higher temperature that is between about 340° C. and 390° C. As set forth in the experimental portion herein, the heating step can comprise heating a silicon substrate that may also include portions, or an entire covering of, other materials thereon such as silicon dioxide.

Furthermore, in a preferred embodiment the Cu(hfa)$_2$ can be introduced into a system or reaction chamber containing the substrate from a source of Cu(hfa)$_2$ that has been heated to a temperature of between about 95° C. and 120° C. and in a flow of an inert gas. The temperature of the copper (II) hexafluoroacetylacetonate source determines the relative amount of vaporized Cu(hfa)$_2$ in the gas flow.

Finally, in one preferred embodiment, the laser light used is that produced by a 530 nm xenon laser. It will be understood, however, that in the invention the sole purpose and requirement of the laser is its ability to heat a localized portion of the substrate, rather than any photochemical effect that it could otherwise provide.

Experimental

An experimental open tube atmospheric pressure reactor was designed and constructed with the purpose of studying the thermal decomposition parameters of metal hexafluoroacetylacetonates. The apparatus consisted of an evaporator, where the hexafluoroacetylacetonate compound was evaporated; a horizontal reaction chamber, where substrates were placed and where the decomposition reaction carried out; and a manifold, exhaust and control system for diluent gas and carrier gas. The substrates were placed horizontally on a pedestal which is in direct contact with a heated susceptor. The susceptor, external to the system, was formed of silicon carbide and was heated by means of a high density radiant heater (Model 5208, Research Incorporated, Minneapolis, Minnesota 55424) with phase angle power controller. This type of heating made it possible to avoid extensive heating of the reactor walls. The design of the CVD apparatus facilitated varying the process parameters; the temperature of the evaporator, the substrate temperature, the composition of the reaction medium, and the drift velocity of the gas over the susceptor.

Copper (II) hexafluoroacetylacetonate was purchased from Strem Chemicals, Incorporated, (Newburyport, Massachusetts 01950). Its melting point, as determined from differential thermal analysis, was 94°-96° C.

Thin film deposits obtained as a result of the thermal decomposition of the Cu(hfa)$_2$ vapor phase were analyzed by means of x-ray photoelectron spectroscopy (XPS), Rutherford backscattering spectroscopy (RBS), and x-ray diffraction methods. The thickness of the films was measured by means of a stylus profilometer Dektak 3030 (Sloan Technology Corporation, Santa Barbara, California 93103). As a separate measure of the deposit quality, resistivities were determined using a five-point probe (Model 635B; Texas Instruments Incorporated, Houston, Texas 77006).

Depositions were carried out on bare silicon wafers (i.e., those with 1-2 nm of native oxide) and with oxidized wafers (i.e. with 200 nm of SiO$_2$) obtained via a plasma oxidation process. Argon (ultra-pure grade; Air Products and Chemicals, Incorporated, Allentown, Pennsylvania 18901) was used as both the carrier and the diluent gas in the deposition process.

Using this apparatus, deposits were obtained on substrates heated to 340° C., 430° C., and 650° C., respectively. Before the spectra were taken, the deposited films were sputter cleaned in order to remove atmospheric contamination. The XPS spectra of the resulting deposits showed a dramatic change in the chemical composition of the deposits as the deposition temperature was increased. Only copper was detected in the deposit obtained at 340° C. Alternatively, the high temperature (650° C.) deposit appeared to be composed mainly of carbon (i.e. Cu, O, and F were not detected).

The sputter depth XPS profiles were also obtained for the same samples. They did not indicate any significant variation of the elemental concentrations except for the deposit obtained at 430°. In this film the carbon content was greater and the oxygen content was smaller at the gas-film interface than in the bulk of the film.

Table I summarizes the results on the chemical compositions of the deposits, and their resistivities in the investigated range of substrate temperatures. The temperature of the evaporator, the diluent gas flow rate, and the carrier gas flow rate were kept constant, the only variable parameter being the temperature of the substrates. The temperature of the evaporator and the flow rate of the carrier gas were chosen, based on a transpiration study of the Cu(hfa)$_2$-argon system. The flow rate of the diluent gas was chosen so as to obtain an approximately uniform deposition along the susceptor. The average composition of the deposits was evaluated on the basis of depth profiling XPS analyses. For some films deposited on bare silicon wafers an additional RBS analysis was performed. The average atomic concentrations of elements, determined through the RBS measurements were consistent within 15% with those obtained through the XPS depth profiling.

TABLE 1

Chemical Composition and Resistivity (p) of Deposits Obtained for Different Process Conditions (nd = not detected)

| | Carrier gas Flow Rate (ml/min) | Diluent gas Flow Rate (ml/min) | Temp. of evaporator (°C.) | Temp. of substrates (°C.) |
|---|---|---|---|---|
| 1. | 12 | 300 | 120 | 650 |
| 2. | 12 | 300 | 120 | 500 |
| 3. | 12 | 300 | 120 | 430 |
| 4. | 12 | 300 | 120 | 390 |
| 5. | 12 | 300 | 120 | 340 |
| 6. | 12 | 300 | 120 | 250 |

TABLE 1-continued

Chemical Composition and Resistivity (p) of
Deposits Obtained for Different Process Conditions
(nd = not detected)

| | Composition of deposits (atomic percent) | | | | p |
|---|---|---|---|---|---|
| | Cu | C | O | F | ($\Omega$cm) |
| 1. | nd | 100 | nd | nd | $>1 \times 10^{-3}$ |
| 2. | nd | 100 | nd | nd | $>2 \times 10^{-3}$ |
| 3. | 25 | 65 | 10 | nd | $3 \times 10^{-2}$ |
| 4. | 100 | nd | nd | nd | $7 \times 10^{-6}$ |
| 5. | 100 | nd | nd | nd | $3-6 \times 10^{-6}$ |
| 6. | | | No deposition | | |

The data presented in Table I indicate that the carbon content of the films increases with the temperature of the substrates. The low temperature (340° C.) deposit consists of copper. The high temperature (650° C.) product, however, is essentially a carbon film. The X-ray diffraction pattern for the 340° C. deposit showed a line at a position corresponding to the (111) reflection in copper. The X-ray spectrum of the deposit obtained at 650° C. contained peaks due solely to those from the silicon substrate. The absence of lines from the film indicates that the carbon deposit is amorphous.

The data presented in Table I further indicates that at lower temperatures the decomposition of the Cu(hfa)$_2$ occurs as a result primarily of breaking the bonds between the metal ion and the organic ligand. The reaction can be depicted by [1]:

Metal-ligand→Metal+Volatile ligand     [3]

From the data set, it appears that when the decomposition temperature is increased the organic ligand itself also begins to undergo a fragmentation. Since only carbon was detected by XPS in the deposits obtained at 500° and 650° C. (Table I), the products of this dissociation reaction must be a volatile species which contains metal, C, O and F and a nonvolatile species composed nearly entirely of carbon. The presence of oxygen, in addition to carbon, in the films obtained at temperatures about 430° C. indicates that the actual composition of the deposits is a result of competition between different decomposition pathways dominating at different temperatures. Further, if the decomposition is the result of heterogeneous reaction, the film composition in the temperature interval above which pure copper is deposited could also be influenced by the rate of the desorption of volatile products.

As expected, the resistivity of the films increases as the amount of carbon increases. The resistivity of pure copper films, obtained at 340° C., is 3-6 microhm centimeters ($\mu\Omega$ cm) which is somewhat greater than the resistivity of bulk copper material. However, thin films generally exhibit resistivities greater than bulk values so it is believed those obtained in the present study are about the best that might be expected. These slightly higher resistivities could be due to metal contaminants in the films since the Cu(hfa)$_2$ used in the CVD process was not of semiconductor quality.

Thicknesses of the films were in the range of 0.1 to 1.2 $\mu$m depending on the time of the deposition process and the temperature of the substrates. At 340° C. under the conditions specified in Table I for obtaining pure copper deposits, the film growth rate was on the order of 4 nm/min, and it was found to decrease with decreasing Cu(hfa)$_2$ vapor phase concentration in the reaction zone.

The data in Table I indicate also that there is a threshold value of temperature, approximately 250° C., below which no deposit of any kind was obtained. Practically, useful deposition temperatures appear to lie in the interval 340°-390° C.

Results of the preliminary studies on the thermal decomposition of copper (II) hexafluoroacetylacetonate in an open-tube system in an inert atmosphere of argon indicate that the substrate temperature is critical if pure copper film deposits are desired. The studies lead to the conclusion that at lower temperatures the reaction that dominates is one in which only Cu-ligand bonds in the metal-organic compound are broken, and the ligand is volatilized with minimal fragmentation; thus, pure metallic films result. At higher temperatures, the films contain carbon and oxygen in addition to copper because the organic ligand is also fragmented depositing carbon in the process. This carbon is entrained in the growing films. At the highest temperatures examined only carbon was observed by XPS analysis. The purest copper films were obtained at a substrate temperature of between about 340° and 390° C.

In the specification, there have been disclosed typical preferred embodiments of the invention and, although specific terms have been employed, they have been used in a generic and descriptive sense only and not for purposes of limitation, the scope of the invention being set forth in the following claims.

That which is claimed is:

1. A thermally activated method of depositing a metal on a localized microscopic portion of a substrate, that can be carried out at relatively low process temperatures, and that is particularly useful for depositing metals in an amount and purity sufficient for electrical conductivity on substrates containing microelectronic circuits and devices or their respective precursors, the method comprising:
   heating a substrate in the presence of vaporized copper (II) hexafluoroacetylacetonate to a first temperature that is just below the temperature at which the vaporized copper (II) hexafluoroacetylacetonate will dissociate into metallic copper and hexafluoroacetylacetonate for a time sufficient for the substrate to reach the first temperature; and thereafter
   maintaining the substrate at the first temperature while raising the temperature of a smaller localized portion of the heated substrate from the first temperature to a second, higher temperature at which the vaporized copper (II) hexafluoroacetylacetonate will dissociate into metallic copper and hexafluoroacetylacetonate but below the temperature at which the hexafluoroacetylacetonate will decompose and until an amount of the dissociated metallic copper sufficient for electrical conductivity deposits upon the localized portion.

2. A method according to claim 1 wherein the step of heating the substrate to a first temperature in the presence of vaporized copper (II) hexafluoroacetylacetonate comprises heating the substrate to a temperature of no more than about 250° C.

3. A method according to claim 1 wherein the step of raising the temperature of a localized portion of the heated substrate in the presence of vaporized copper (II) hexafluoroacetylacetonate to a second, higher temperature comprises raising the temperature of the substrate to a temperature of between about 340° C. and 390° C.

4. A method according to claim 3 wherein the step of raising the temperature of a localized portion of the heated substrate comprises directing laser light onto the localized portion, with the laser light having a frequency to which the substrate will respond thermally and an intensity sufficient to produce the desired temperature.

5. A method according to claim 1 wherein the step of heating the substrate to the first temperature comprises thermally biasing the substrate.

6. A method according to claim 5 wherein the step of thermally biasing the substrate comprises radiant heating of a susceptor upon which the substrate rests.

7. A thermally activated method for depositing a film of low resistivity copper in an amount and purity sufficient for electrical conductivity onto the surface of a substrate to repair a broken electrical interconnection line thereon, and that can be carried out at relatively low process temperatures, the method comprising:

heating a substrate in the presence of a vaporized copper (II) hexafluoroacetylacetonate to a first temperature that is just below the temperature at which the vaporized copper (II) hexafluoroacetylacetonate will dissociate into metallic copper and a volatile organic-containing species for a time sufficient for the substrate to reach the first temperature; and thereafter maintaining the substrate at the first temperature while raising the temperature of the heated substrate at a smaller localized portion corresponding to the identified broken line to a second, higher temperature at which the vaporized copper (II) hexafluoroacetylacetonate will dissociate into metallic copper and a volatile organic-containing species white below the temperature at which the volatile organic-containing species will decompose and until an amount of the dissociated metallic copper sufficient for electrical conductivity deposits upon the heated localized portion.

8. A method according to claim 7 further comprising the step of identifying a broken line on the surface of the substrate prior to the step of further heating the broken line to the second, higher temperature.

9. A method according to claim 7 wherein the step of heating a substrate having an identified broken line thereon in the presence of vaporized copper (II) hexafluoroacetylacetonate to a first temperature comprises introducing vaporized copper (II) hexafluoroacetylacetonate adjacent the substrate surface and then heating the substrate to the first temperature.

10. A method according to claim 7 wherein the step of heating the substrate to a first temperature comprises heating the substrate to a temperature of no more than about 250° C.

11. A method according to claim 7 wherein the step of raising the temperature of the identified broken line to a second temperature comprises raising the temperature of the identified broken line to a temperature greater that about 250° C., but less than about 650° C.

12. A method according to claim 7 wherein the step of raising the temperature of the identified broken line to a second temperature comprises raising the temperature of the identified broken line to a temperature of between about 340° C. and 390° C.

13. A method according to claim 7 wherein the step of heating the substrate to a first temperature comprises heating an entire substrate wafer.

14. A thermally activated method for depositing a film of low resistivity copper in an amount and purity sufficient for electrical conductivity onto the surface of a substrate to repair a broken line thereon, and that can be carried out at relatively low process temperatures, the method comprising:

identifying a broken line on the surface of a substrate;

heating the substrate in the presence of a vaporized copper (II) hexafluoroacetylacetonate to a first temperature that is no more than about 250° C., and below the temperature at which the vaporized copper (II) hexafluoroacetylacetonate will dissociate into metallic copper and a volatile organic-containing species for a time sufficient for the substrate to reach the first temperature; and thereafter maintaining the substrate at the first temperature while directing laser light onto a smaller localized portion of the substrate corresponding to the identified broken line wherein the laser light has a frequency to which the substrate will respond thermally and an intensity sufficient to raise the temperature of the localized portion from no more than about 250° C. to a second, higher temperature that is between about 340° C. and 390° C. and at which the vaporized copper (II) hexafluoroacetylacetonate will dissociate into metallic copper and a volatile organic-containing species but at which the volatile organic-containing species will not decompose and for a time sufficient to deposit an amount of the dissociated metallic copper sufficient for electrical conductivity upon the identified broken.

15. A method according to claim 14 wherein the step of heating the substrate comprises heating a silicon substrate.

16. A method according to claim 14 wherein the step of heating the substrate comprises heating a silicon substrate having portions of silicon dioxide thereon.

17. A method according to claim 14 wherein the step of heating the substrate in the presence of vaporized copper (II) hexafluoroacetylacetonate further comprises introducing copper (II) hexafluoroacetylacetonate carried in acetylacetonate source in which the source is maintained at a temperature of between about 95° C. and 120° C.

18. A method according to claim 14 wherein the step of directing laser light onto the identified broken line comprises directing the light from a Xenon laser onto the identified broken line.

19. A thermally activated method for depositing a film of low resistivity copper in an amount and purity sufficient for electrical conductivity onto the surface of a substrate to repair a broken line thereon, and that can be carried out at relatively low process temperatures, the method comprising:

directing laser light onto a small localized portion of a heated substrate corresponding to an identified broken line thereon, wherein the substrate has been heated to and maintained at, in the presence of a vaporized copper (II) hexafluoroacetylacetonate, a first temperature that is no more than about 250° C., and below the temperature at which the vaporized copper (II) hexafluoroacetylacetonate will dissociate into metallic copper and a volatile organic-containing species wherein the laser light has a frequency to which the substrate will respond thermally and an intensity sufficient to raise the temperature of the localized portion of the heated substrate corresponding to the broken line from no more than about 250° C. to a second, higher temperature that is between about 340° C. and 390° C. and at which the vaporized copper (II) hexafluoracetylacetonate will dissociate into metallic copper and a volatile organic-containing species but at which the volatile organic-containing species will not decomposes and for a time sufficient to deposit an amount of the dissociated metallic copper sufficient for electrical conductivity upon the identified broken, and while maintaining the remainder of the substrate at the first temperature.

* * * * *

UNITED STATES PATENT AND TRADEMARK OFFICE
CERTIFICATE OF CORRECTION

PATENT NO. : 5,145,714

DATED : September 8, 1992

INVENTOR(S) : Reisman et al

It is certified that error appears in the above-indentified patent and that said Letters Patent is hereby corrected as shown below:

On the title page, Item [56]

UNDER "OTHER PUBLICATIONS":

In the first reference, "Oehi" should be --Oehr--.

At column 6, lines 5 and 7, "x-ray" should be --X-ray--.

At column 6, line 35, after "430°", please insert --C--.

At column 7, line 30, after "by" insert --Equation--.

At column 7, line 32, after "ligand", "[3]" should be --[1]--.

IN THE CLAIMS:

At column 9, line 38, "white" should be --while--.

At column 10, line 34, after "broken", insert --line--.

UNITED STATES PATENT AND TRADEMARK OFFICE
CERTIFICATE OF CORRECTION

PATENT NO. : 5,145,714

DATED : September 8, 1992

INVENTOR(S) : Reisman et al.

It is certified that error appears in the above-identified patent and that said Letters Patent is hereby corrected as shown below:

At column 10, line 45, after "carried in", please insert -- an inert gas and from a copper (II) hexafluoro- --

At column 12, line 2, "decomposes" should be --decompose--.

At column 12, line 5, after "broken", insert --line--.

Signed and Sealed this

Twenty-sixth Day of October, 1993

Attest:

BRUCE LEHMAN

Attesting Officer

Commissioner of Patents and Trademarks